United States Patent [19]

Esser et al.

[11] 4,110,777

[45] Aug. 29, 1978

[54] CHARGE-COUPLED DEVICE

[75] Inventors: Leonard Jan Maria Esser; Matthias Johannes Joseph Theunissen, both of Eindhoven, Netherlands

[73] Assignee: U.S. Philips Corporation, New York, N.Y.

[21] Appl. No.: 545,408

[22] Filed: Jan. 30, 1975

[30] Foreign Application Priority Data

Feb. 13, 1974 [NL] Netherlands .................. 7401939

[51] Int. Cl.² ............................................. H01L 29/78
[52] U.S. Cl. ........................................ 357/24; 357/89
[58] Field of Search ................................. 357/24, 89

[56] References Cited

U.S. PATENT DOCUMENTS

| | | | |
|---|---|---|---|
| 3,792,322 | 2/1974 | Boyle et al. ............................. | 357/24 |
| 3,796,932 | 3/1974 | Amelio et al. .......................... | 357/24 |
| 3,852,799 | 12/1974 | Walden ................................... | 357/24 |

Primary Examiner—Edward J. Wojciechowicz
Attorney, Agent, or Firm—Frank R. Trifari; Steven R. Biren

[57] ABSTRACT

The invention relates to a charge-coupled device in which the charge transport takes place in the form of majority charge carriers via the bulk of a surface layer of the first conductivity type which forms a p-n junction with a substrate of the second conductivity type. The comparatively thick and high-ohmic surface layer has a comparatively thin low-ohmic buried zone of the first conductivity type which adjoins the said p-n junction. The buried zone forms a buffer layer against the depletion zone belonging to the p-n junction. Without detrimentally influencing the transport properties, a low-ohmic substrate may be used, which has important advantages in particular with respect to the leakage currents.

12 Claims, 8 Drawing Figures

CHARGE-COUPLED DEVICE

The invention relates to a charge-coupled device having a semiconductor body comprising a semiconductor layer of one conductivity type and an adjoining part, hereinafter termed substrate, of the second conductivity type which forms a p-n junction with the layer, in which means are present to isolate the semiconductor layer from the surroundings and said layer has a thickness and a doping concentration at which a depletion zone can be obtained throughout the thickness of the semiconductor layer by means of an electric field, while avoiding breakdown, in which means are present to locally introduce into the semiconductor layer information in the form of charge consisting of majority charge carriers and means to read out the information elsewhere in the layer, in which on the side of the layer opposite to the substrate an electrode system is present to capacitively generate electric fields in the semiconductor layer by means of which the charge can be transported to the read-out means in a direction parallel to the layer.

The term "electrode system" should be considered in a very wide sense so that, for example, semiconductor zones of the second conductivity type which are separated from the semiconductor layer by blocking p-n junction or a piezoelectric layer with which electric fields can be formed in the semiconductor layer, are also included. In the most frequently occurring cases, however, the electrode system is formed by a number of juxtaposed electrodes in the form of conductive layers which are isolated from the semiconductor layer by an intermediate thin insulating layer of, for example, silicon oxide.

A charge-coupled device of above-described kind is distinguished in particular from the more conventional charge-coupled devices in which the charge storage and the charge transport take place mainly along the surface of the semiconductor layer (or semiconductor body) in that at least the last fractions of the information-containing charge packets — which fractions mainly determine the speed of the charge transport — are siphoned in the interior or the bulk of the semiconductor layer. Since said fractions are siphoned at a comparatively large distance from the electrodes — i.e. at a distance which is comparable to the width of the electrodes —, said transport can mainly take place under the influence of electric fields. As a result of this the transport rate can be much larger than in the said more conventional charge-coupled devices in which the charge transport of the last fractions takes place mainly by means of diffusion.

In order to prevent the flow, during the charge transport, of majority charge carriers (which belong to an information-forming charge packet and are driven by the electrodes from the surface in the direction of the substrate) across the p-n junction between the layer and the substrate, said p-n junction is biased in the reverse direction during operation. In the case, for example, when the semiconductor layer consists of n-type silicon and the substrate of p-type silicon, the substrate is biased negatively relative to the semiconductor layer. The thickness of the depletion layer which is formed and extends partly in the semiconductor layer and partly in the substrate determines to a considerable extent the leakage current across the p-n junction between the semiconductor layer and the substrate. It is inter alia for this reason that a highly doped or low-ohmic substrate is preferred over a low-doped or high-ohmic substrate because the thickness of the said depletion layer and hence the value of the leakage current generally decreases as the doping in the substrate increases.

The expressions "highly doped, low-ohmic, low doped and high-ohmic" should be considered in a relative sense. For example, a "low-ohmic substrate" is to be understood to mean a substrate whose resistivity is much lower than the resistivity of the bulk of the semiconductor layer.

However, one of the drawbacks of the use of a low-ohmic substrate is that the depletion layer belonging to the blocked p-n junction between the substrate and the semiconductor layer then extends further into the semiconductor layer. The result of this may be that at a given reverse voltage across the p-n junction between the substrate and the semiconductor layer, the transport of the last fractions of charge carriers still to be siphoned of the information-containing charge packets takes place at a smaller distance from the electrodes than would be desired with a view to the transport rate and/or the transport inefficiency.

In known embodiments of the above-described charge-coupled devices, the means destined for isolating the semiconductor layer from the surroundings are formed by isolation zones of the same conductivity type as the substrate which bound the semiconductor layer laterally and form a blocking p-n junction with the layer and extend from the surface down into the substrate. The bias voltage at the isolation zones which in this embodiment can be supplied via the substrate preferably is at least so large that at the surface near the electrodes the p-n junction between the isolation zones and the semiconductor layer also remains blocked. As a result of this it is often necessary to apply a larger voltage difference between the substrate and the semiconductor layer than would actually be desired with a view to the transport properties of the device.

It is therefore an object of the present invention to provide a charge-coupled device which presents a wider choice as regards the doping concentration of the substrate and/or the voltages to be applied to the substrate, while maintaining good transport properties.

The invention is inter alia based on the recognition that by providing a buffer layer between the semiconductor layer and the substrate in the form of a thin highly-doped layer of the same conductivity type as the semiconductor layer, the extent of the depletion zone between the substrate and the semiconductor layer and hence the influence of the doping concentration of the substrate and/or the voltage of the substrate on the operation of the device can advantageously be reduced.

Therefore in a charge-coupled device in accordance with the invention, the semiconductor layer has a buried zone of one conductivity type which adjoins the p-n junction between the substrate and the semiconductor layer and extends from the p-n junction only over a part of the thickness of the semiconductor layer, and has a higher doping than the adjoining part of the semiconductor layer which is present adjacent the buried zone.

The expression "adjoins" should be understood to include not only embodiments in which the highly doped low-ohmic buried zone forms a metallurgic junction with the substrate, but also embodiments in which the highly doped buried zone is present at such a small distance from the substrate that by applying a suitable voltage to the substrate the buried zone can be depleted entirely or for the greater part.

Due to the comparatively high doping of the buried zone the depletion layer occupies the buried zone and the substrate entirely or for the greater part but penetrates into the semiconductor layer substantially not further than the buried zone. As a result of this, the choice of possibilities as regards the doping concentration of the substrate and/or the voltages to be applied to the substrate are advantageously extended considerably while maintaining the good transport properties of the charge-coupled device.

Important advantages can be obtained when the doping concentration of the buried zone is as little as approximately 10 times larger than the doping concentration of the adjoining low doped part of the semiconductor layer. A preferred embodiment of a charge-coupled device according to the invention is characterized in that the doping concentration of the buried zone is at least approximately 100 times the doping concentration of the adjoining lower doped part of the semiconductor layer which is present between the buried zone and the one side.

The said buried zone-adjoining lower doped part of the semiconductor layer may have a uniform doping concentration. However, the invention presents particular advantages in a preferred embodiment which is characterized in that in addition the semiconductor layer comprises, at least locally below the electrode system, a surface zone of the one conductivity type which is more highly doped than the part of the semiconductor layer present between said surface zone and the buried zone.

Charge-coupled devices in which the semiconductor layer has a highly doped surface zone of one conductivity type form the subject matter of the non-prepublished Dutch Patent Application 73.03778 which corresponds to U.S. Pat. No. 4,012,759. In the devices described in said Patent Application the charge storage and/or the charge transport takes place in the immediate proximity of the surface of the semiconductor layer, while only the transport of the last fractions of quantity of charge carriers to be siphoned takes place at a large distance from the surface (and hence from the electrodes). In such charge-coupled devices the presence of a buffer zone between the substrate and the semiconductor layer may be of very great advantage because the semiconductor layer preferably is a high-ohmic material.

A further preferred embodiment of a charge-coupled device according to the invention is characterized in that the substrate of the second conductivity type comprises at least a part which adjoins the p-n junction between the substrate and the semiconductor layer and whose doping concentration is at least 10 times and preferably at least 100 times the doping concentration of the said comparatively low doped part of the semiconductor layer adjoining the buried zone.

Advantageously, the more highly doped buried zone of the semiconductor layer may directly adjoin and form a metallurgic junction with the said highly doped part of the substrate. In this embodiment the advantage is obtained in particular that the depletion layer associated with the p-n junction between the substrate and the semiconductor layer and hence the leakage current across the p-n junction can be very small.

A preferred embodiment of a charge-coupled device according to the invention is characterized in that the said highly doped part of the substrate and the comparatively highly doped buried zone belonging to the semiconductor layer are separated from each other by an intermediate semiconductor region having a low doping concentration. During operation of the device the intermediate semiconductor region can be depleted entirely and then forms a dielectric layer between the highly doped part of the substrate and the semiconductor layer. The capacitive coupling between the low-ohmic part of the substrate and the charge carriers to be transported is reduced by said intermediate depleted semiconductor region, which increases the rate of the charge transport.

According to the invention, a configuration which has proved to be particularly advantageous as regards the charge transport is characterized in that the distance between the highly doped buried zone and the highly doped part of the substrate is substantially equal to the distance between the comparatively highly doped buried zone and the electrode system.

The intermediate low-doped semiconductor region may advantageously consist of semiconductor material of the same conductivity type as the semiconductor layer. However, a preferred embodiment which inter alia has the advantage that its manufacture is simple is characterized in that the said intermediate low doped region is of the same conductivity type as and has a lower doping than the adjoining highly doped part of the substrate.

In a preferred embodiment which is particularly simple to manufacture the highly doped buried zone is formed by a layer-shaped region which extends at least along substantially the whole p-n junction between the semiconductor layer and the substrate.

The buried, highly doped zone may be provided, for example, by providing the substrate with a highly doped surface zone of the first conductivity type. Said surface zone can be obtained by means of diffusion of a suitable impurity, for example arsenic, or by means of ion implantation. The adjoining low doped part of the semiconductor layer through which the charge transport takes place mainly can then be provided in the form of an epitaxially grown layer. A preferred embodiment of a charge-coupled device according to the invention is characterized in that the highly doped buried zone and the adjoining low doped part of the semiconductor layer are formed by layers of the same conductivity type but of mutually different doping concentrations which are grown epitaxially. In this preferred embodiment the high-ohmic intermediate region — if present — between the buried zone and the low-ohmic part of the substrate may also be formed by an epitaxial region which is provided on the low-ohmic substrate.

A further preferred embodiment of a charge-coupled device according to the invention is characterized in that the semiconductor layer comprises a number of buried zones of one conductivity type which are present at a distance from each other, each adjoining the p-n junction between the substrate and the semiconductor layer, extending in the layer from the p-n junction between the substrate and the semiconductor layer only over a part of the thickness of the layer and each having a higher doping concentration than an adjoining part of the semiconductor layer present between the buried zone and the one side. During operation, potential barriers or thresholds for the majority charge carriers to be transported may be formed at the area of the interruptions between the highly doped buried zones. Said thresholds give the charge transport a direction so that the device can be operated as a so-called two-phase system. This way of operation in which only two clock lines are present has inter alia the advantage that no crossing wires are required. In a first embodiment, viewed in the direction from the said one side to the substrate, a buried zone may be provided below each electrode, the electrodes in the direction opposite to the direction of charge transport projecting beyond the edge of the underlying buried zones. In a second embodiment, also viewed in a direction from the said side to the substrate, a highly doped buried zone is present below only every other electrode, each electrode forming a phase together with a juxtaposed electrode.

The invention will now be described in greater detail with reference to a few embodiments and the accompanying diagrammatic drawing, in which FIG. 1 is a plan view of a part of a charge-coupled device according to the invention;

Figure 1:
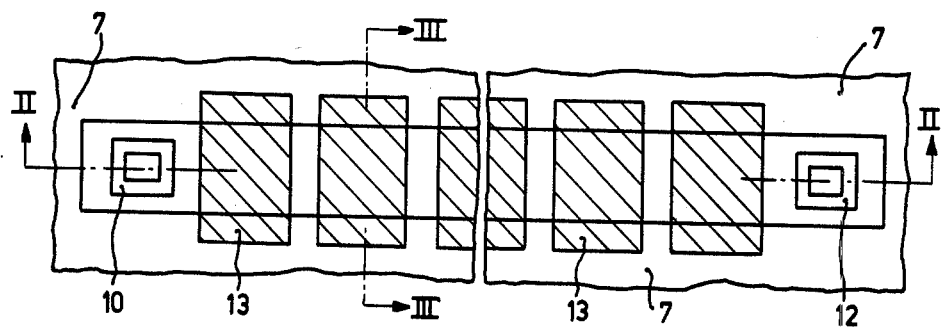
Figure 2:
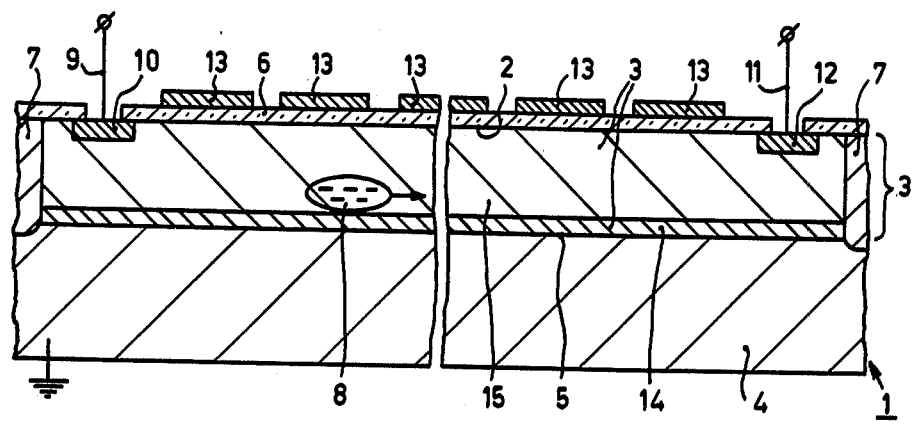
FIG. 2 is a sectional view of the device shown in FIG. 1 taken on the line II—II of FIG. 1.
Figure 3:
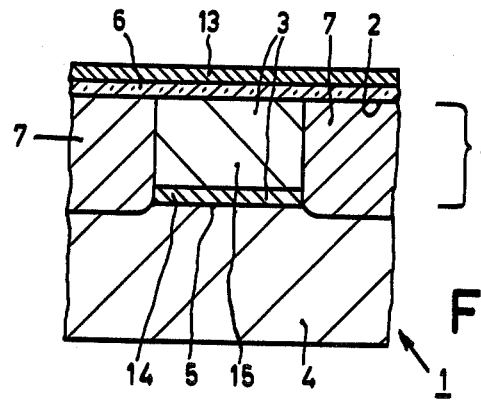
FIG. 3 is a sectional view of the device shown in FIG. 1 taken on the line III—III of FIG. 1.

FIG. 1 is a plan view and FIGS. 2 and 3 are cross-sectional views taken on the lines II—II and III—III, respectively, of a part of a charge-coupled device according to the invention. The device comprises a semiconductor body 1 of silicon having an n-type semiconductor layer 3 adjoining the surface 2 and a p-type part 4 which adjoins the layer 3 and is hereinafter referred to as substrate, and forms the p-n junction 5 with the layer 3. The substrate 4 with the p-n junction 5 forms part of means of insulate the semiconductor layer 3 electrically from its surroundings. Said insulation means furthermore include the layer 6 of insulating material, for example, silicon oxide, provided on the surface 2 and the p-type surface zones or regions 7 which, as shown in the plan view of FIG. 1, surround the n-type layer 3 entirely and, like the substrate, constitute a reverse p-n junction with the layer 3. In the present embodiment the zones 7 extend from the surface 2 down to in the substrate and can hence be biased via the substrate 4. In certain circumstances, however, it is also possible for the zones 7 to extend only over a part of the thickness of the semiconductor layer 3 in which the insulation of the layer 3 can furthermore be completed by applying a sufficiently large negative bias to the zones 7.

The thickness and the doping concentration of the semiconductor layer 3 — through which the charge-transport takes place — have been chosen to be so small that by means of an electric field a depletion zone can be obtained throughout the thickness of the semiconductor layer 3 while avoiding breakdown. By using such a thin high-ohmic semiconductor layer 3 which can be insulated from the surroundings, the charge transport can take place mainly, and at least for the last fractions of the charge packets to be siphoned, via the bulk of the semiconductor layer 3 as is shown diagrammatically in FIG. 2 by the charge packet 8 which moves to the right.

Said charge forms information which can locally be introduced in the form of majority charge carriers into the semiconductor layer 3, for example, via an electric input which is denoted diagrammatically by the contact 9 and the n+ contact zone 10. It is to be noted that the expression "majority charge carriers" is to be understood to mean in this connection that type of charge carriers the concentration of which in thermal equilibrium and/or in the absence of external electric fields is larger than the concentration of charge carriers of the other type. In the present embodiment in which the layer 3 is n-type doped this means that the information processing in the layer 3 takes place by means of electrons.

Instead of electrically via the input (9, 10), the electrons 8 can of course also be introduced differently, for example, by generation in the semiconductor layer 3 as a result of absorption of radiation. In this case the quantity of electrons 8 may form a measure of the local intensity of said radiation.

The device furthermore comprises an output which is shown diagrammatically by the output contact 11 and the n+ contact zone 12 where the charge packets 8 can be read and dissipated.

On one side, namely the side present at the surface 2 and opposite to the substrate 4, the semiconductor layer 2 has an electrode system for capacitively generating electric fields in the semiconductor layer by means of which the charge 8 can be transported to the read-out means (11, 12) in a direction parallel to the layer 3. The electrode system is formed by a number of electrodes 13 in the form of conductive layers of a suitable material, for example aluminium, which are separated from the semiconductor layer 3 by the insulating silicon oxide layer 6. Of course, instead of aluminium, the electrodes 13 may also be manufactured from other materials, for example, polycrystalline silicon, or of metals which form a Schottky junction with the semiconductor layer 3. The electrodes 13 may also be provided from p-type surface zones diffused in the semiconductor layer 3. In this latter case the width of the electrodes should be adapted to the width of the semiconductor layer in such manner that, electrically, the zones are not connected to the insulation zones 7 but that the semiconductor layer 3 can be depleted throughout the width between the zones and the insulation zones 7 with the given clock voltages to be applied to the zones or electrodes. In the present embodiment, however, in which the electrodes are separated from the semiconductor layer 3 by the oxide layer 6, the electrodes 13 may extend across the width of the layer 3 to above the insulation zones 7, as is shown in FIGS. 1 and 3. Dependent upon whether the device is operated as a two-phase, three-phase, or four-phase charge-coupled device, the electrodes 13 may be connected together electrically in two, three or four groups by clock lines for applying clock voltages to the electrodes. Said clock lines are not shown in FIG. 1 for reasons of clarity. The oxide layer 6 is not shown either in FIG. 1 for reasons of clarity.

As is shown in FIGS. 2 and 3, the semiconductor layer 3 has an n-type buried zone 14. Said zone adjoins the p-n junction 5 between the substrate 4 and the semiconductor layer 3 and, viewed from the p-n junction 5, extends in the direction of the surface 2 only over a part of the thickness of the semiconductor layer 3. The buried zone 14 has the same conductivity type as the adjoining part 15 which is present between the buried zone 14 and the surface 2 but has a doping concentration that is higher than that of said adjoining part of the semiconductor layer 3.

It is to be noted that the zone 14 is termed a buried zone due to its situation in the interior of the semiconductor body 1 and not due to the technology used for providing said zone or the path of charge transport.

The highly doped (or highly doped as compared with the lower doped part 15) zone 14 forms a buffer layer between the semiconductor layer 3 and the substrate 4 so that the choice of possibilities as regards inter alia the doping concentration of the substrate 4 and/or the voltages to be applied to the substrate 4 or across the p-n junction 5 are considerably and advantageously increased as will be described in detail hereinafter.

The thickness of the buried zone 14 is approximately 0.5 $\mu$m and that of the low doped part 15 approximately 5 $\mu$m. The doping concentration of the low doped part 15 is approximately $5 \times 10^{14}$ atoms per ccm, which corresponds to a resistivity of approximately 10 ohm.cm. The concentration of the highly doped buried zone 14 is approximately $5 \times 10^{16}$ atoms per ccm, which corresponds to a resistivity of approximately 0.1 ohm.cm.

The thickness of the p-type substrate is not critical and is approximately 250 $\mu$m. The doping concentration of the substrate is approximately of the same value as the concentration of the buried zone 14 and therefore is also approximately $5 \times 10^{16}$ atoms per ccm, which corresponds to a resistivity of approximately 0.4 ohm.cm. Therefore the substrate 4 is very highly doped with respect to the high-ohmic part 15 of the semiconductor layer 3.

As shown in FIG. 2, the highly doped low-ohmic buried zone 14 is formed by a layer-shaped region which extends along the whole p-n junction 5 between the layer 3 and the substrate 4. The semiconductor layer 3 is provided as an epitaxial layer, in which the highly doped buried zone 14 is deposited on the substrate by epitaxy after which the low-doped high-ohmic layer 15 is obtained in the same epitaxy process simply by reducing the concentration of dopants (for example arsenic).

During operation the substrate 4 is set up at a reference potential, for example earth, while a voltage of approximately 25 volts is applied to the semiconductor layer 3, for example, via the output contact (11, 12). The electrodes 13 can be connected electrically to clock voltage sources — not shown — so that the potential of the electrodes with a given oxide thickness of approximately 0.1 $\mu$m can vary between 0 and 10 volts. Starting from the situation that all majority charge carriers, so electrons, are removed from the semiconductor layer, it can be calculated that for electrons a potential minimum in the depleted semiconductor layer 3 is obtained approximately halfway the thickness of the semiconductor layer 3. In said minimum, charge packets in the form of electrons can be introduced via the input (9, 10) and/or be stored. By suitable choice of the clock voltages at the electrodes, said charge packets can each time be transported from a region below an electrode 13 to a region below the next electrode. The charge transport of the last fractions 8 of the charge packets can take place advantageously at a comparatively large distance from the electrodes 13, in spite of the comparatively high doping of the substrate 4. Due to the comparatively high doping concentration of the thin buried zone 14, the depletion layer belonging to the reverse p-n junction 5 is nevertheless comparatively narrow, taking into account the voltage across said p-n junction. Due to the high doping concentration of the low-ohmic substrate 4 the thickness of the said depletion region which belongs to the reverse p-n junction 5 and hence the leakage current across said p-n junction can advantageously be restricted.

Figure 4:
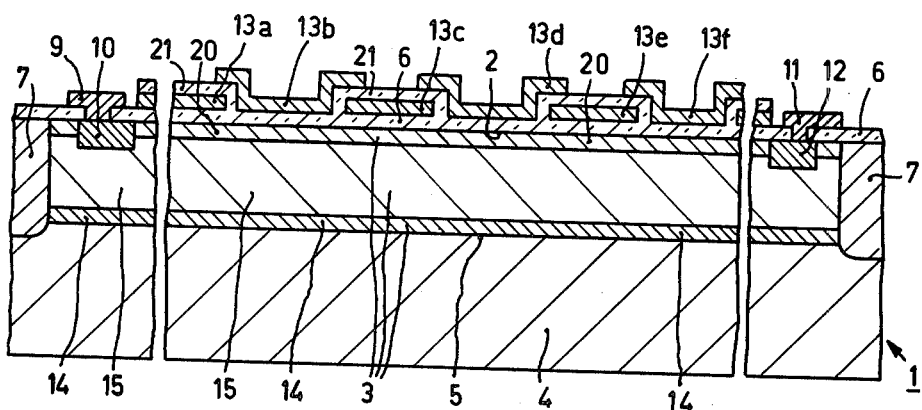
FIG. 4 is a sectional view of a part of a second embodiment of a charge-coupled device according to the invention.

FIG. 4 is a cross-sectional view corresponding to the cross-sectional view shown in FIG. 2 of a part of a second charge-coupled device according to the invention. In this device, corresponding components are referred to by the same reference numerals as in the device described in the first embodiment. The difference with the last-mentioned device resides in particular in the fact that the n-type semiconductor layer 3 in which the charge transport takes place now has not only the highly doped n-type buried zone 14 but also a highly doped n-type surface zone 20. In the present embodiment the surface zone 20 extends as a continuous layer along the surface 2 but may also be provided only locally below the electrode system in the form of partial zones. The thickness of the surface zone is small as compared with the thickness of the semiconductor layer 3 and is, for example, approximately 0.3 $\mu$m. The doping concentration of the surface zone 20 on the contrary is higher than the doping concentration of the adjoining low doped high-ohmic part 15 present between the zones 14 and 20 and is approximately $5 \times 10^{16}$ atoms per cm.

The function of the surface zone 20 has been described inter alia in the not yet prepublished Dutch Patent Application No. 73.03778, which corresponds to U.S. Pat. No. 4,012,759. As a result of the high concentration of the surface zone 20 the information-containing charge packets can be stored and/or transported nearly entirely in the zone 20, hence very close to the surface 2, while only the transport of the last fractions of charge carriers to be siphoned — which mainly determine the transport time — can take place via the low doped part 15 of the semiconductor layer 3, hence at a comparatively large distance from the surface 2. As a result of this the charge capacity of the device is advantageously increased while maintaining good transport properties. The doping concentration of the part 15 of the semiconductor layer 3 present below the surface zone 20 is preferably chosen to be as low as possible and is, for example, $10^{14}$ atoms per ccm. The thickness of the low doped part 15 is approximately 5 $\mu$m. With the given low doping concentration the presence of the highly doped n-type buried zone 14 as a buffer layer between the substrate 4 and the high-ohmic part 15 is desired in particular. In spite of the low doping concentration of the n-type part 15, the doping concentration of the p-type substrate 4 may be chosen to be so high as is desired with a view to the leakage currents across the p-n junction 5.

The device can be operated in the same manner as the device in the preceding embodiment. An additional important advantage of the highly doped buried zone 14 can be obtained by introducing during operation, at least locally, a constant quantity of electrons as a background in the semiconductor layer 3. The information can be transported to the output (11, 12) as a quantity of electrons superimposed upon the background and together with the background quantity.

Such a way of operation of a charge-coupled device is described inter alia in the non-prepublished Dutch Patent Application No. 73.16495 which corresponds to U.S. Pat. No. 4,012,754 the contents of which, insofar as applicable to the devices described, are deemed to be incorporated in the present Application. This way of operation, which has the advantage that the transport rate can be further increased and/or the transport inefficiency can be further reduced by eliminating the influence of bulk centers in the layer 3, makes sense in the devices of the type to which the invention relates if the electrons are not distributed homogeneously over the semiconductor layer but when, for example, as a result of the highly doped surface zone 20, a strong concentration of electrons occurs near the surface in a comparatively small region, while a small part of the electrons is sufficient to fill a large part, namely the high-ohmic part 15, of the layer 3. Due to the presence of the highly doped buried zone 14 the effect of this way of operation can be further increased in that the influence of the size of the charge packets on the volume occupied by the charge carriers is further reduced. The background quantity of charge may constitute a comparatively small part of the charge to be transported maximally and may be chosen by those skilled in the art in such manner that a favorable compromise is obtained as regards the transport efficiency and the quantity of information-forming charge.

The device can be manufactured by means of methods known per se in semiconductor technology. The buried zone 14, the high-ohmic part 15 and the low-ohmic surface zone 20 may be provided one after the other on the p-type substrate 4 in the form of epitaxial layers of the same conductivity type and different doping concentrations.

The electrode system shows, by way of example, a structure which differs a little from the structure of the electrode system of the charge-coupled device described in the preceding embodiment. The electrodes 13a, 13c, 13e, and so on are provided in the form of layers of polycrystalline silicon which has been deposited on the silicon oxide layer 6. The electrodes 13b, 13d, 13f, and so on are formed by aluminium layers but may, of course, also consist of a different suitable material. The electrodes 13b, 13d, 13f overlap the electrodes 13a, 13c, 13e partly and are separated herefrom by an intermediate oxide layer 21. The silicon oxide layer 21 can be obtained by slightly oxidizing the electrodes 13a, 13c, 13e and so on of polycrystalline silicon.

The electrode structure used in this embodiment has the advantage that the occurrence of potential pits at the surface 2 between the electrodes 13 can be prevented and hence the remaining of charge carriers to be transported.

Figure 5:
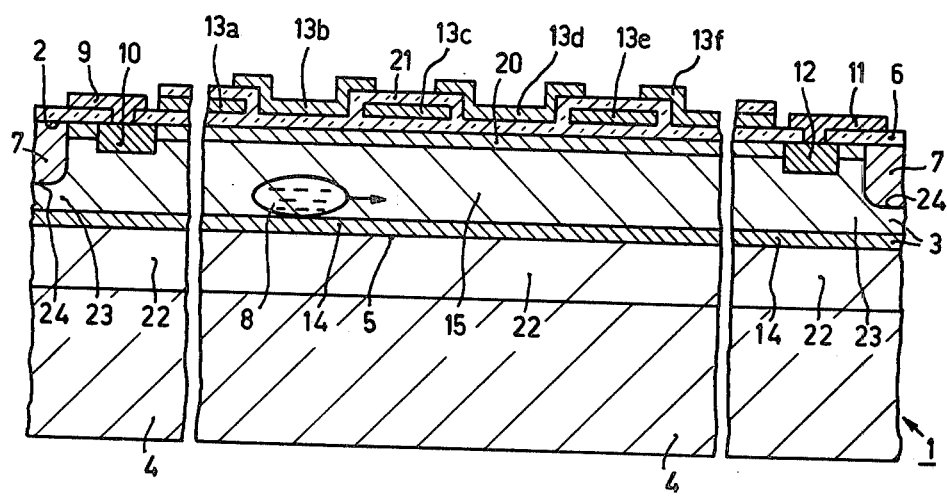
FIG. 5 is a sectional view parallel to the direction of charge transport of a part of a third charge-coupled device according to the invention.

FIG. 5 is a cross-sectional view, corresponding to the cross-sectional view shown in FIG. 4, of a part of a further charge-coupled device according to the invention. As regards corresponding components, the device bears the same reference numerals as the charge-coupled devices described in the preceding embodiments.

The device according to the present embodiment differs from the preceding described charge-coupled devices in particular in that the comparatively highly doped p-type substrate 4 and the comparatively highly doped buried n-type zone 14 are separated from each other by an intermediate semiconductor region 22 having a comparatively low doping concentration.

Due to the presence of the high-ohmic intermediate region 22 the capacitive influence of the substrate 4 on the charge transport is considerably reduced, which may be of great advantage for the transport rate.

In the present embodiment, the distance between the buried zone and the highly doped part of the substrate is substantially equal to the distance between the highly doped buried zone 14 and the electrodes 13. Such a structure proves to be particularly advantageous since the last fractions 8 of electrons to be siphoned can be transported through the semiconductor layer at a distance which is substantially equally large to the substrate 4 as to the electrodes 13.

The intermediate comparatively low doped semiconductor region 22 which, if desired, may also be of the same conductivity type as the layer 3 is formed in the device shown in FIG. 5 by a p-type layer of the same conductivity type as the substrate 4 and a lower doping concentration than the substrate. The region 22, as the semiconductor layer 3, may be provided on the substrate 4 by epitaxy of silicon. The thickness of the region 22 is approximately 3 $\mu$m, while the doping concentration is approximately $10^{14}$ atoms per ccm.

Because as a result of the high-ohmic intermediate region 22 an extra negative voltage is required at the substrate 4 (in the order of 10 Volts) so as to deplete the highly doped buried zone 14, the doping concentration of the buried zone has been chosen to be slightly lower than in the preceding embodiment and is in this case approximately $10^{16}$ atoms per ccm. The thickness of the zone 14 is again approximately 0.5 $\mu$m. The doping concentration and the thickness of the high-ohmic, low doped part 15 are approximately $10^{14}$ atoms per ccm and 3 $\mu$m, respectively, and of the highly doped surface zone 20 approximately $5.10^{16}$ atoms per ccm and 0.3 $\mu$m, respectively.

It is to be noted that the leakage current across the p-n junction 5 in the present embodiment may be slightly larger than in the preceding embodiment due to the presence of the high-ohmic intermediate region 22. However, this need not be too large a drawback since, by using the low-ohmic substrate 4 and the low-ohmic buffer zone 14 said leakage current may nevertheless be comparatively low as compared with devices in which a high-ohmic substrate is used. In addition, by using the low-ohmic substrate 4, the high-ohmic intermediate region 22 and the low-ohmic buried buffer layer 14 a favorable compromise can be obtained between the requirements imposed upon the device as regards the leakage currents across the p-n junctions 5 on the one hand and requirements as regards the transport rate on the other hand.

It is furthermore to be noted that, by way of example, the p-type insulation zones 7 in the present embodiment show a slightly different form from the insulation zones 7 in the preceding embodiments. Instead of down to the substrate 4, the zones 7 extend from the surface 2 only over a part of the thickness of the semiconductor layer 3. In this case the electric insulation of the semiconductor layer 3 may be further completed by applying across the p-n junction 24 between the insulation zone 7 and the semiconductor layer 3 a sufficiently large reverse voltage so that the part 23 of the semiconductor layer present between the buried zone 14 and the insulation zones is depleted. The semiconductor layer 3 may then be insulated entirely by the zones 7, the depletion layer in the region 23 belonging to the p-n junction 24, and the adjoining depletion layer belonging to the p-n junction 5 between the substrate and the semiconductor layer. Since the insulation zones 7 do not extend down to the substrate, the voltage to be applied to the zones 7 may be chosen to be so that inversion of the conductivity type below the electrodes 13 — in which holes could be introduced into the semiconductor layer 3 via the insulation zones — is prevented.

Figure 6:
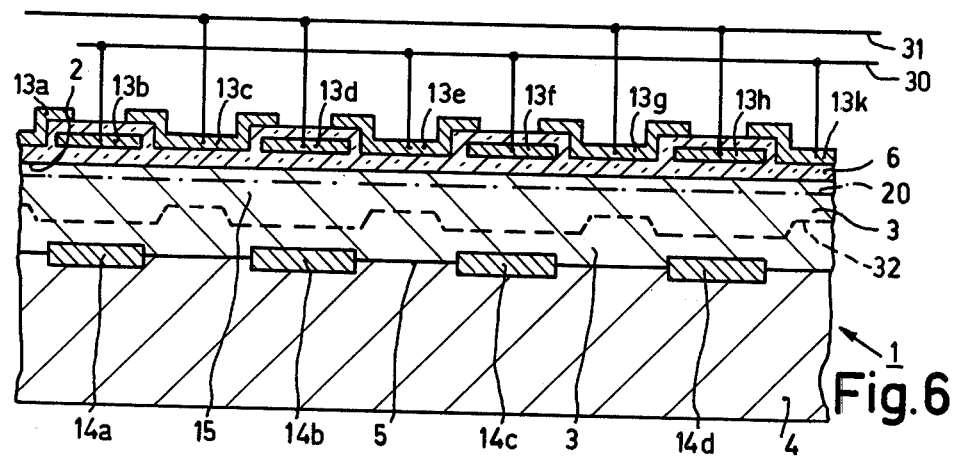
FIG. 6 is a sectional view of a two-phase charge-coupled device according to the invention.

FIG. 6 is a sectional view of a part of a fourth charge-coupled device according to the invention. This device may be operated as a so-called two-phase charge-coupled device having only two clock voltage sources. In the figures this is shown diagrammatically by the two clock lines 30 and 31 which are conductively connected to the electrodes 13b, 13e, 13f, 13k and 13c, 13d, 13g, 13h, respectively. Such a way of operation is possible in that, unlike in the preceding embodiments, the n-type semiconductor layer 3 is not provided with a continuous highly doped buried zone 14 but with a number of buried n-type zones which, for mutual distinction, are denoted by 14a, 14b, 14c and so on. The zones 14 are present at a distance from each other and, viewed on the surface 2, extend below the electrodes 13b, 13d, 13f, 13h and so on, and each adjoin the p-n junction 5 between the p-type substrate 4 and the n-type semiconductor layer 3.

Just as the buried zone 14 in the preceding embodiments, the zones 14a, b, c, d and so on, in the present embodiment also extend from the p-n junction 5 only over a part of the thickness of the layer 3 in the semiconductor layer 3. The zones 14a, b, c and so on, are of the same conductivity type as but have a higher doping concentration than the adjoining part 15 of the semiconductor layer 3 which is present between the buried zones and the surface 2.

The zones 14a, b, c, d and so on constitute locally buffer zones between the substrate 4 and the semiconductor layer 3 which give the device an asymmetry and hence a transport direction. For illustration hereof, the variation of the negative potential in the interior of the semiconductor layer 3 — with equal voltages at the electrodes 13 — is denoted in FIG. 6 by the broken lines 32. At the area of the buried zones 14 which, with complete depletion of the semiconductor layer 3, cause a larger voltage drop across the p-n junction 5, potential pits or wells are formed in which electrons can be stored. Potential thresholds are formed between the zones 14a, b, c and so on. By applying, for example, between the clock lines 30 and 31, an alternating difference in voltage, the charge packets consisting of electrons can be transported from one storage space present below an electrode 13b, 13c, 13f consisting of polycrystalline silicon to a subsequent storage space present below one of the said electrodes.

In the present embodiment the buried zones 14 are formed by zones which are provided in the low-ohmic p-type substrate by means of diffusion or ion implantation of a suitable activator, for example arsenic, before providing the high-ohmic part 15 of the semiconductor layer 3 in the form of an n-type epitaxial layer.

Figure 7:
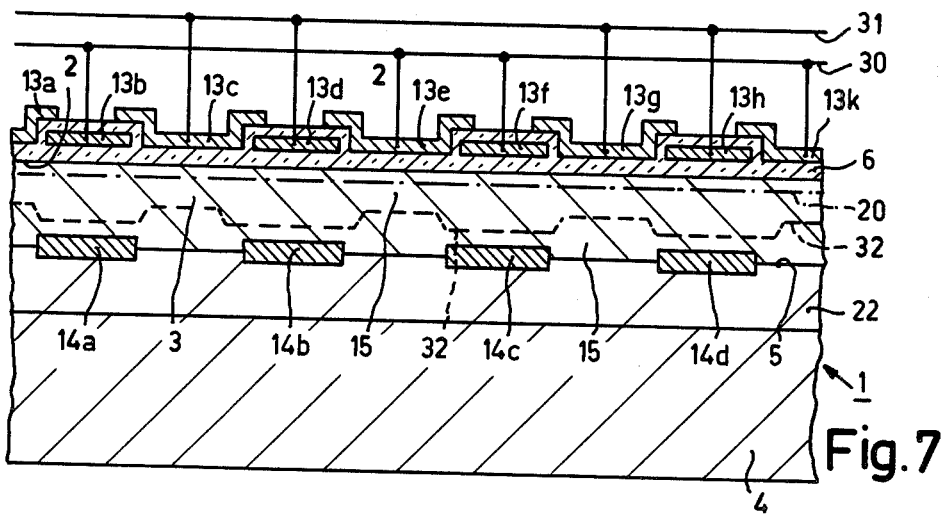
FIG. 7 is a sectional view of a part of a further two-phase device according to the invention.

FIG. 7 is a cross-sectional view of a variation of the two-phase charge-coupled device according to the invention shown in FIG. 6. The highly doped buried zones 14a, b, c and so on are not formed, as in FIG. 6, by zones provided in the substrate but are separated from the substrate by an intermediate high-ohmic semiconductor region which has approximately the same thickness and composition as the high-ohmic semiconductor region 22 in the embodiment described with reference to FIG. 5 and which therefore bears reference numeral 22. By said high-ohmic intermediate region 22 a capacitive decoupling between the substrate and the charge carriers to be transported in the semiconductor layer 3 can advantageously be obtained and hence an increase of the drift field.

The charge-coupled device shown in FIG. 7 can be manufactured by first providing the high-ohmic p-type intermediate region on the p-type substrate 4 by means of epitaxy. The zones 14a – 14d can be provided by increasing in the intermediate region 22 the doping concentration at the area of the zones 14a – 14d and then providing the high-ohmic part of the semiconductor layer 3 by epitaxy.

In the embodiments shown in FIGS. 6 and 7 the highly doped buried zones, viewed on the surface, are provided in the layer 3 only every other electrode, that is to say only below the electrodes 13b, 13d, 13f, 13h and so on. The parts of the semiconductor layer 3 present below said electrodes form charge storage spaces. During operation, information in the form of majority charge carriers is usually present only below every fourth electrode.

Figure 8:
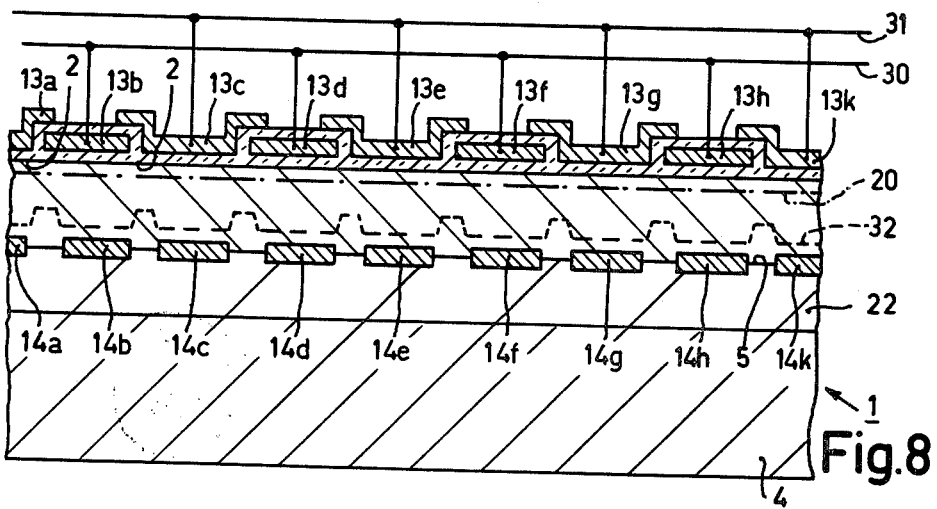
FIG. 8 is a sectional view of a part of a further charge-coupled device which can be operated as a two-phase device.

FIG. 8 is a sectional view of an embodiment of the two-phase charge-coupled device according to the invention in which a very large information density can be obtained. The device shown in this Figure differs from the device described in the preceding example in that, viewed on the surface, a highly doped, n-type buried zone 14a–14k is present in the semiconductor layer 3 below each electrode 13a–13k. As is furthermore apparent from FIG. 8, the electrodes 13a–13k each extend on the left hand to over the edge of the buried zone 14a–14k present below the electrodes. As a result of this, potential pits (for electrons) which are shown diagrammatically by the broken line 32 are formed in the semiconductor layer 3 at the area of or above the buried zones 14, and potential barriers which are present between the buried zones and below the left-hand edge of the electrodes. In the device according to the present embodiment every two juxtaposed electrodes 13 thus form a phase. The electrodes are alternately connected to the clock line 30 or 31, the electrodes 13b, d, f, h and so on of polycrystalline silicon being connected to the clock line 30 and the electrodes 13a, c, e, g, k and so on being connected to the clock line 31.

It will be obvious that the invention is not restricted to the Examples described of a charge-coupled device according to the invention, but that many variations are possible to those skilled in the art without departing from the scope of this invention.

For example, the conductivity types in the embodiments described may be reversed. In said reversal, of course, the polarity of the voltages to be applied should also be reversed.

Instead of a high-ohmic intermediate region between the buried zone and the low-ohmic part of the substrate of the same conductivity type as the substrate, a high-ohmic intermediate region of the same conductivity type as the semiconductor layer may also be used.

Instead of the said materials, other suitable materials may also be used. For example, the semiconductor body 1 may also consist of germanium or another suitable semiconductor material.

Furthermore, the n-type semiconductor layers 3 in the two-phase structure shown in FIGS. 6–8, as well as the semiconductor layer 3 in the device shown in FIG. 4 may be provided with a thin comparatively highly doped n-type top layer 20 which is denoted by a dot-and-dash line in FIGS. 6, 7 and 8.

In the case in which the semiconductor layer is fully or partly insulated from adjoining parts of the epitaxial layer by means of capacitively produced electric fields, for example in the embodiment shown in FIG. 5 in which the insulation zones 7 extend in the epitaxial layer only over a part of the thickness of the epitaxial layer, said adjoining parts may advantageously be provided with an electric connection for applying a suitable voltage and/or draining generated charge carriers.

We claim:

1. A charge-coupled device having a semiconductor body portion comprising a semiconductor layer of a first type conductivity, an adjoining substrate of a second type conductivity below said semiconductor layer which forms a p-n junction with the layer, means for electrically isolating the layer from its surroundings, said layer a thickness and a doping concentration such that a depletion zone is obtainable throughout the thickness thereof by applying a suitable electric field thereto, input means for locally introducing into the semiconductor layer information in the form of charge consisting of majority charge carriers, output means spaced apart from said input means for reading out said information, electrode means above the upper surface of the layer and electrically insulated therefrom for capacitively generating electric fields in the semiconductor layer upon application of a suitable signal to said electrode means to cause charge to be transported through the layer to the output means in a direction parallel to the layer, and a buried zone of said first type conductivity in said semiconductor layer and adjoining the p-n junction between the substrate and the semiconductor layer, which buried zone extends upwardly from the p-n junction up through only a minor part of the total thickness of the semiconcuctor layer and has a higher doping concentration than the adjoining remainder of the semiconductor layer which is present above the buried zone.

2. A charge-coupled device as claimed in claim 1, wherein the doping concentration of the buried zone is at least approximately 10 times larger than the doping concentration of the adjoining remainder of the semiconductor layer which is present above the buried zone.

3. A charge-coupled device as claimed in claim 1 wherein the semiconductor layer further comprises, at least locally below the electrode system, a surface zone of said first type conductivity in the uppermost portion of said layer which is more highly doped than the middle portion of the semiconductor layer present below said surface zone and above the buried zone.

4. A charge-coupled device as claimed in claim 1, wherein the substrate of the second type conductivity comprises a more highly doped portion which adjoins the p-n junction between the substrate and the semiconductor layer and which has a doping concentration of at least 10 times the doping concentration of said remainder of the semiconductor layer above the buried zone.

5. A charge-coupled device as claimed in claim 4, wherein said more highly doped portion of the substrate and the more highly doped buried zone of the semiconductor layer are separated from each other by an intermediate semiconductor region having a relatively lower doping concentration.

6. A charge-coupled device as claimed in claim 5, wherein the distance between the more highly doped buried zone and the more highly doped part of the substrate is substantially equal to the distance between the more highly doped buried zone and the electrode means.

7. A charge-coupled device as claimed in claim 5, wherein said intermediate semiconductor region is of the same conductivity type as and has a lower doping concentration than the more highly doped part of the substrate.

8. A charge-coupled device as claimed in claim 1, wherein the more highly doped buried zone is formed by a layer-shaped region which extends along substantially the entire p-n junction between the semiconductor layer and the substrate.

9. A charge-coupled device as claimed in claim 8, wherein the more highly doped buried zone and the adjoining remainder of the semiconductor layer are formed by epitaxial layers of the same conductivity type but of different doping concentrations.

10. A charge-coupled device as claimed in claim 1, wherein the semiconductor layer has a plurality of buried zone portions of said first type conductivity which are spaced apart from each other and adjoin the p-n junction between the substrate and the semiconductor layer.

11. A charge-coupled device as claimed in claim 1, wherein the doping concentration of the buried zone is at least approximately 100 times larger than the doping concentration of the adjoining remainder of the semiconductor layer which is present above the buried zone.

12. A charge-coupled device as claimed in claim 1, wherein the substrate of the second type conductivity comprises a more highly doped portion which adjoins the p-n junction between the substrate and the semiconductor layer and which has a doping concentration of at least 100 times the doping concentration of said remainder of the semiconductor layer above the buried zone.

* * * * *

UNITED STATES PATENT AND TRADEMARK OFFICE
CERTIFICATE OF CORRECTION

PATENT NO. : 4,110,777
DATED : August 29, 1978
INVENTOR(S) : LEONARD J.M. ESSER ET AL It is certified that error appears in the above-identified patent and that said Letters Patent are hereby corrected as shown below:

Claim 1, line 7, "a thickness" should be --having a thickness--
line 25, "semiconcuctor" should be --semiconductor--

Signed and Sealed this

Sixth Day of March 1979

[SEAL]

Attest:

RUTH C. MASON
Attesting Officer

DONALD W. BANNER
Commissioner of Patents and Trademarks